United States Patent
Niu et al.

(10) Patent No.: US 10,729,015 B2
(45) Date of Patent: Jul. 28, 2020

(54) PRE-PRESS HEAD AND OPERATING METHOD OF PRE-PRESS HEAD

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Honglin Niu, Beijing (CN); Ronghua Fan, Beijing (CN); Peng Sui, Beijing (CN); Guangxiang Wang, Beijing (CN); Meiyan Tao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 329 days.

(21) Appl. No.: 15/534,736

(22) PCT Filed: Jan. 6, 2017

(86) PCT No.: PCT/CN2017/070400
§ 371 (c)(1),
(2) Date: Jun. 9, 2017

(87) PCT Pub. No.: WO2017/181742
PCT Pub. Date: Oct. 26, 2017

(65) Prior Publication Data
US 2018/0199444 A1    Jul. 12, 2018

(30) Foreign Application Priority Data
Apr. 21, 2016   (CN) .......................... 2016 1 0252347

(51) Int. Cl.
*H05K 3/30*     (2006.01)
*H05K 13/00*    (2006.01)

(52) U.S. Cl.
CPC ........... *H05K 3/30* (2013.01); *H05K 13/0069* (2013.01); *H05K 2203/0195* (2013.01)

(58) Field of Classification Search
CPC ........ H05K 3/30; H05K 3/32; H05K 13/0069; H05K 2203/0195
(Continued)

(56) References Cited

U.S. PATENT DOCUMENTS 5,207,553 A * 5/1993 Konagai .............. B25J 15/0616
                                                     294/65
5,609,377 A * 3/1997 Tanaka ................. B65G 47/918
                                                     294/65
(Continued)

FOREIGN PATENT DOCUMENTS

CN      201859279 U     6/2011
CN      203512839 U     4/2014
(Continued)

OTHER PUBLICATIONS

Office Action dated Dec. 25, 2017 issued in corresponding Chinese Application No. 201610252347.4.
(Continued)

*Primary Examiner* — Paul T Chin
(74) *Attorney, Agent, or Firm* — Nath, Goldberg & Meyer; Joshua B. Goldberg

(57) ABSTRACT

A pre-press head may be operated by an operating method. The pre-press head includes an adsorption unit and a control unit. The adsorption unit includes at least two vacuum adsorption structures each including a gas path and at least one gas hole communicated with the gas path. The control unit is configured to control, according to a size of a to-be-adsorbed object, formation of vacuum environment of each vacuum adsorption structure. The adsorption unit is configured to adsorb the to-be-adsorbed object under the
(Continued)

control of the control unit. The solution provided by the application adjusts adsorption functions of the vacuum adsorption structures according to a size of a to-be-adsorbed circuit board, so that the pre-press head can be applicable to circuit boards having different sizes.

12 Claims, 2 Drawing Sheets

(58) Field of Classification Search
USPC .................................................. 294/183, 185
See application file for complete search history.

(56) References Cited

U.S. PATENT DOCUMENTS

| | | | | |
|---|---|---|---|---|
| 5,857,667 | A * | 1/1999 | Lee ..................... | B25B 11/005 |
| | | | | 269/21 |
| 5,883,357 | A * | 3/1999 | Newman ............ | B23K 26/0853 |
| | | | | 219/121.67 |
| 6,397,885 | B1 * | 6/2002 | Golden ................ | F04F 5/52 |
| | | | | 137/565.22 |
| 8,485,579 | B2 * | 7/2013 | Roajanasiri ........... | G11B 5/41 |
| | | | | 294/183 |
| 9,630,325 | B2 | 4/2017 | Wang et al. | |
| 2003/0102682 | A1 * | 6/2003 | Kurokawa .......... | H01L 21/6838 |
| | | | | 294/188 |
| 2004/0195850 | A1 * | 10/2004 | Ogimoto ............. | B65G 49/061 |
| | | | | 294/185 |
| 2008/0145190 | A1 * | 6/2008 | Yassour ............... | H01L 21/00 |
| | | | | 414/147 |
| 2010/0289283 | A1 * | 11/2010 | Watanabe ......... | H01L 21/67132 |
| | | | | 294/183 |
| 2016/0243706 | A1 * | 8/2016 | Wang .................... | B25J 15/0616 |

FOREIGN PATENT DOCUMENTS

| | | |
|---|---|---|
| CN | 104609183 A | 5/2015 |
| CN | 204309305 U | 5/2015 |
| CN | 105960106 A | 9/2016 |

OTHER PUBLICATIONS

International Search Report dated Mar. 3, 2017 corresponding to application No. PCT/CN2017/070400.

* cited by examiner

PRE-PRESS HEAD AND OPERATING METHOD OF PRE-PRESS HEAD

This is a National Phase Application filed under 35 U.S.C. 371 as a national stage of PCT/CN2017/070400, filed Jan. 6, 2017, an application claiming the benefit of Chinese Application No. 201610252347.4, filed Apr. 21, 2016, the content of each of which is hereby incorporated by reference in its entirety.

TECHNICAL FIELD

The present invention relates to the field of display technology, and particularly relates to a pre-press head and an operating method thereof.

BACKGROUND

During a process of manufacturing a display, a pre-press device is used for pre-pressing (also referred to as pseudo-pressing, or pseudo-bonding) a pin line on a circuit board to a display panel. Currently, a module factory produces various kinds of products, and has varied production facilities. Each kind of products correspond to one circuit board, and because the circuit boards are of different sizes, a large number of jigs need to be replaced every time models are switched, which leads to low production efficiency and relatively high purchasing cost. Replacement of jigs not only takes a lot of time (occupying about ⅓ of the time required for switching models), but also easily leads to other problem during disassembly and installation, causing great inconvenience to the management and maintenance of a production line.

SUMMARY

To solve the above problem, the present invention provides a pre-press head and an operating method thereof, which can at least partially solve the problem of low production efficiency and relatively high purchasing cost caused by replacing jigs due to different sizes of circuit boards in the prior art.

Therefore, the present invention provides a pre-press head, including an adsorption unit and a control unit, the adsorption unit includes at least two vacuum adsorption structures each including a gas path and at least one gas hole, the gas hole being communicated with the gas path;

the control unit is configured to control, according to a size of a to-be-adsorbed object, formation of a vacuum environment of each of the vacuum adsorption structures; and the adsorption unit is configured to adsorb the to-be-adsorbed object under the control of the control unit.

Optionally, the control unit includes at least one valve structure and at least one vacuum pump provided correspondingly, the valve structure and the vacuum pump are connected to the gas path of the corresponding vacuum adsorption structure, respectively; and the valve structure and the vacuum pump are configured to control the formation of the vacuum environment of the corresponding vacuum adsorption structure.

Optionally, the valve structure is configured such that:

when the valve structure is opened, the gas path of the corresponding vacuum adsorption structure is communicated with the vacuum pump so that the vacuum pump evacuates gas from the vacuum adsorption structure or breaks the vacuum environment of the vacuum adsorption structure; and when the valve structure is closed, the gas path of the corresponding vacuum adsorption structure is isolated from the vacuum pump to maintain current environment of the corresponding vacuum adsorption structure.

Optionally, the valve structure includes a control module, a valve module and a pipe, the valve module being connected to the control module and the pipe, respectively, and the pipe being connected to the gas path of the corresponding vacuum adsorption structure;

the valve module is configured to switch on or off communication between the gas path of the corresponding vacuum adsorption structure and the vacuum pump under the control of the control module; and the vacuum pump is configured to evacuate gas from the vacuum adsorption structure or break the vacuum environment of the vacuum adsorption structure as required.

Optionally, the valve structure is an electromagnetic valve.

Optionally, the number of the vacuum adsorption structures is three.

Optionally, the number of the vacuum adsorption structures is three, and the number of the at least one valve structure is three.

Optionally, the pre-press head includes one vacuum pump, which is connected to the gas paths of the at least two vacuum adsorption structures, respectively.

Optionally, the pre-press head includes valve structures and vacuum pumps which have a same number and are in one-to-one correspondence. Optionally, the to-be-adsorbed object is a COF or an FPC.

The present invention provides an operating method of a pre-press head, the pre-press head including an adsorption unit and a control unit, the adsorption unit including at least two vacuum adsorption structures each including a gas path and at least one gas hole, the gas hole being communicated with the gas path; and the operating method of the pre-press head including:

controlling, by the control unit, formation of a vacuum environment of each of the vacuum adsorption structures according to a size of a to-be-adsorbed object; and adsorbing, by the adsorption unit, the to-be-adsorbed object under the control of the control unit.

Optionally, the control unit includes at least one valve structure and at least one vacuum pump which are provided correspondingly, the valve structure and the vacuum pump are connected to the gas path of the corresponding vacuum adsorption structure, respectively; and the step of controlling, by the control unit, formation of a vacuum environment of each of the vacuum adsorption structures according to a size of a to-be-adsorbed object includes:

controlling, by the valve structure and the vacuum pump, the formation of the vacuum environment of the corresponding vacuum adsorption structure.

Optionally, the step of controlling, by the valve structure and the vacuum pump, the formation of the vacuum environment of the corresponding vacuum adsorption structure includes:

when the valve structure is opened, communicating the gas path of the corresponding vacuum adsorption structure with the vacuum pump so that the vacuum pump evacuates gas from the vacuum adsorption structure or breaks the vacuum environment of the vacuum adsorption structure; and when the valve structure is closed, isolating the gas path of the corresponding vacuum adsorption structure from the vacuum pump to maintain current environment of the vacuum adsorption structure.

Optionally, the valve structure includes a control module, a valve module and a pipe, the valve module being connected to the control module and the pipe, respectively, and the pipe being connected to the gas path of the corresponding vacuum adsorption structure; and the step of controlling, by the valve structure and the vacuum pump, the formation of the vacuum environment of the corresponding vacuum adsorption structure includes:

switching on or off, by the valve module, communication between the gas path of the corresponding vacuum adsorption structure and the vacuum pump under the control of the control module; and evacuating gas from the vacuum adsorption structure or breaking the vacuum environment of the vacuum adsorption structure as required by the vacuum pump.

Optionally, the valve structure is an electromagnetic valve.

Optionally, the to-be-adsorbed object is a COF or an FPC.

The present invention has the beneficial effects as follows.

In a pre-press head and an operating method thereof provided by the present invention, the pre-press head includes an adsorption unit and a control unit, the adsorption unit includes at least two vacuum adsorption structures, the vacuum adsorption structure includes a gas path and at least one gas hole, and the gas hole is communicated with the gas path. The control unit is configured to control, according to a size of a to-be-adsorbed object, formation of a vacuum environment of each of the vacuum adsorption structures, and the adsorption unit is configured to adsorb the to-be-adsorbed object under the control of the control unit. The technical solution provided by the present invention adjusts adsorption functions of the vacuum adsorption structures according to a size of a circuit board, so that the pre-press head can be applicable to circuit boards having different sizes. Therefore, with the pre-press head provided by the present invention, jigs do not need to be replaced according to sizes of circuit boards, and thus universality is achieved, thereby improving production efficiency, reducing attrition rate of circuit boards and lowering purchasing cost. Meanwhile, inconvenience caused to management and maintenance of a production line by disassembly and installation of the jigs can be avoided. In addition, by controlling individual vacuum adsorption structures separately, not only operating requirements can be satisfied to the largest extent, but also can switch accuracy of circuit boards be ensured, thereby effectively improving equipment utilization and facilitating decrease of defects.

DETAILED DESCRIPTION

To enable those skilled in the art to better understand technical solutions of the present invention, a pre-press head and an operating method thereof provided by the present invention will be described in detail below in conjunction with the accompanying drawings.

First Embodiment

Figure 1:
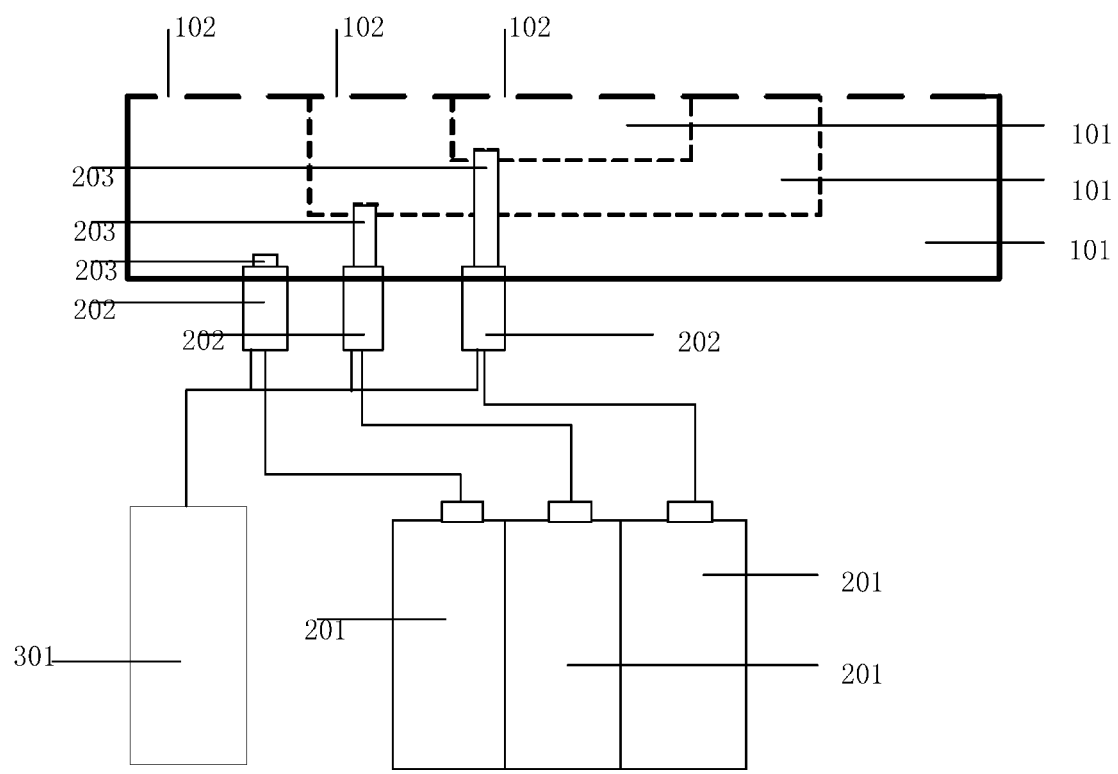
FIG. 1 is a schematic diagram of a structure of a pre-press head provided in a first embodiment of the present invention.
Figure 2:
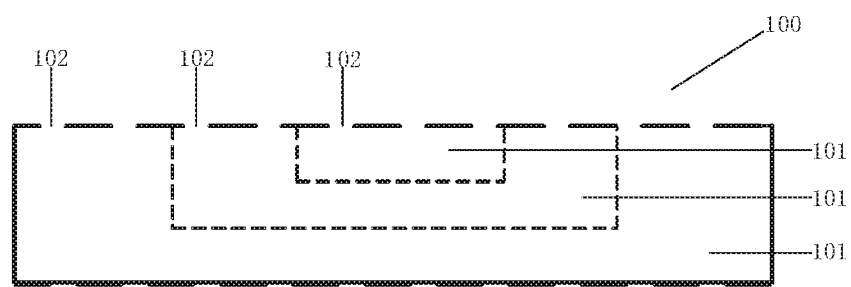
FIG. 2 is a schematic diagram of a structure of an adsorption unit shown in FIG. 1.
Figure 3:
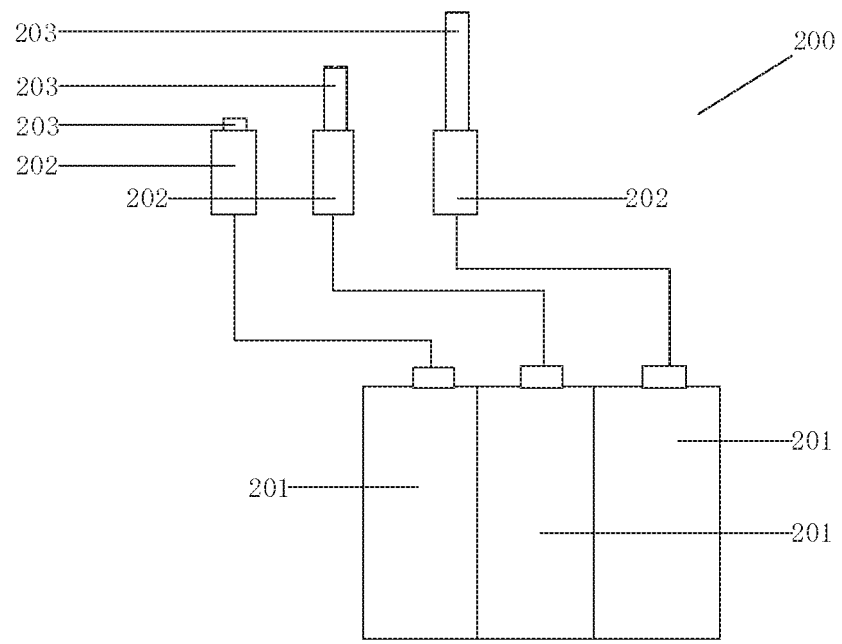
FIG. 3 is a schematic diagram of a structure of a control unit shown in FIG. 1.

FIG. 1 is a schematic diagram of a structure of a pre-press head provided in a first embodiment of the present invention, FIG. 2 is a schematic diagram of a structure of an adsorption unit shown in FIG. 1, and FIG. 3 is a schematic diagram of a structure of a control unit shown in FIG. 1. As shown in FIGS. 1 to 3, the pre-press head includes an adsorption unit 100 and a control unit, and the adsorption unit 100 includes at least two vacuum adsorption structures each including a gas path 101 and at least one gas hole 102, the gas path 101 being communicated with the gas hole 102. Referring to FIGS. 1 to 2, the number of the vacuum adsorption structures is three, and the to-be-adsorbed object is a COF (Chip On Flex or Chip on Film) or an FPC (Flexible Printed Circuit).

In the present embodiment, the control unit controls formation of a vacuum environment of each of the vacuum adsorption structures according to a size of a to-be-adsorbed object, and the adsorption unit 100 adsorbs the to-be-adsorbed object under the control of the control unit. Detailed description is given below by taking three vacuum adsorption structures as an example. When the to-be-adsorbed circuit board has a relatively large size, the control unit may control all of the three vacuum adsorption structures to form a vacuum environment, and the three vacuum adsorption structures are used to adsorb the circuit board. When the to-be-adsorbed circuit board has a relatively small size, the control unit may control a part of the three vacuum adsorption structures (one or two vacuum adsorption structures) to form a vacuum environment, and the part of the three vacuum adsorption structures is used to adsorb the circuit board. In this way, the pre-press head is applicable to circuit boards having different sizes. Therefore, with the pre-press head provided by the present embodiment, jigs do not need to be replaced according to sizes of circuit boards, and thus purpose of universality is achieved, thereby improving production efficiency, reducing attrition rate of circuit boards and lowering purchasing cost. Meanwhile, inconvenience caused to management and maintenance of a production line by disassembly and installation of the jigs can be avoided.

Referring to FIGS. 1 and 3, the control unit includes at least one valve structure 200 and at least one vacuum pump 301 which are provided correspondingly, and the valve structure 200 and the vacuum pump 301 are connected to the gas path 101 of the corresponding vacuum adsorption structure, respectively. The valve structure 200 and the vacuum pump 301 control the formation of the vacuum environment of the corresponding vacuum adsorption structure. Specifically, when the valve structure 200 is opened, the vacuum pump is communicated with the gas path 101 to pump gas into the gas path 101 to break the vacuum environment of the vacuum adsorption structure or evacuate gas from the vacuum adsorption structure to adsorb a circuit board according to whether it is necessary to perform an adsorption operation. When the valve structure 200 is closed, the gas path 101 is isolated from the vacuum pump, at this point, the gas path 101 is in a sealed state and keeps the current environment. Optionally, the valve structure 200 is an electromagnetic valve, the number of the vacuum adsorption structures is three, and the number of the valve structures 200 is three, that is, valve structures and vacuum adsorption structures which have a same number and are in one-to-one correspondence may be provided. However, the present invention is not limited thereto, for example, three vacuum adsorption structures and two valve structures may be provided, one valve structure is configured to control formation of the vacuum environment of two vacuum adsorption structures at the same time, and for example, said one valve structure may be a two-way valve. In FIG. 1, only one vacuum pump 301 is illustrated, but the present invention is not limited thereto, for example, one vacuum pump may be provided for each of the multiple valve structures, so that the multiple vacuum adsorption structures can switch their states quickly. To sum up, in the technical solution provided by the present embodiment, by controlling individual vacuum adsorption structures separately, jigs do not need to be replaced according to sizes of circuit boards, therefore, purpose of universality is achieved, and also, switch accuracy of circuit boards can be ensured, thereby effectively improving equipment utilization and facilitating decrease of defects.

Referring to FIG. 3, the valve structure 200 includes a control module 201, a valve module 202 and a pipe 203, the valve module 202 is connected to the control module 201 and the pipe 203, respectively, and the pipe 203 is connected to the gas path 101. The valve module 202 switches on or off communication between the gas path 101 and the vacuum pump under the control of the control module 201. The vacuum pump changes an inner environment (i.e., creates or breaks a vacuum environment) of the vacuum adsorption structure according to the switching operation of the valve module 202 and whether it is necessary to adsorb an object. In the present embodiment, when the control module 201 controls the valve module 202 to be opened, the gas path 101 is communicated with the vacuum pump, and at this time, the vacuum pump 301 may be used to pump gas into the gas path 101 through the pipe 203 so as to break the vacuum environment of the vacuum adsorption structure, or evacuates gas from the gas path 101 to adsorb an object. When the control module 201 controls the valve module 202 to be closed, the gas path 101 is isolated from the vacuum pump 301, and at this time, the gas path 101 is in a sealed state and keeps the current environment.

The pre-press head provided by the present embodiment includes an adsorption unit and a control unit, the adsorption unit includes at least two vacuum adsorption structures each including a gas path and at least one gas hole, and the gas hole is communicated with the gas path. The control unit is configured to control, according to a size of a to-be-adsorbed object, formation of a vacuum environment of each of the vacuum adsorption structures, and the adsorption unit is configured to adsorb the to-be-adsorbed object under the control of the control unit. The technical solution provided by the present embodiment adjusts adsorption functions of the vacuum adsorption structures according to a size of a to-be-adsorbed circuit board, so that the pre-press head can be applicable to circuit boards having different sizes. Therefore, with the pre-press head provided by the present embodiment, jigs do not need to be replaced according to sizes of to-be-adsorbed circuit boards, and thus universality is achieved, thereby improving production efficiency, reducing attrition rate of circuit boards and lowering purchasing cost. Meanwhile, inconvenience caused to management and maintenance of a production line by disassembly and installation of the jigs can be avoided. In addition, by controlling individual vacuum adsorption structures separately, not only operating requirements can be satisfied to the largest extent, but also can switch accuracy of circuit boards be ensured, thereby effectively improving equipment utilization and facilitating decrease of defects.

Second Embodiment

Figure 4:
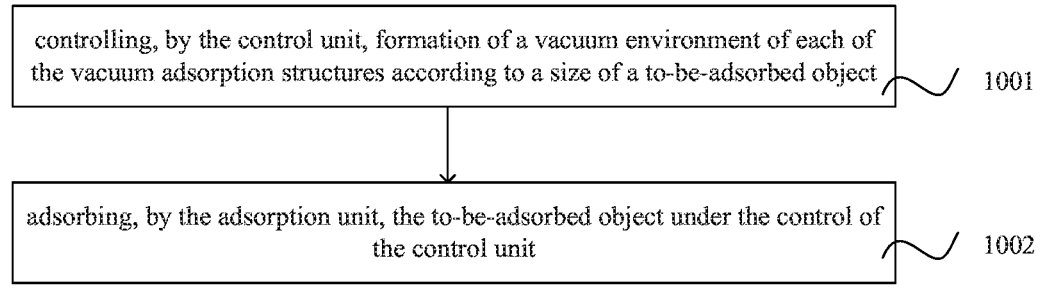
FIG. 4 is a flowchart of an operating method of a pre-press head provided in a second embodiment of the present invention.

FIG. 4 is a flowchart of an operating method of a pre-press head provided in a second embodiment of the present invention. As shown in FIG. 4, the pre-press head includes an adsorption unit and a control unit, the adsorption unit includes at least two vacuum adsorption structures each including a gas path and at least one gas hole, and the gas path is communicated with the gas hole. The operating method of the pre-press head includes:

step 1001: controlling, by the control unit, formation of a vacuum environment of each of the vacuum adsorption structures according to a size of a to-be-adsorbed object; and step 1002: adsorbing, by the adsorption unit, the to-be-adsorbed object under the control of the control unit.

Referring to FIGS. 1 to 3, the number of the vacuum adsorption structures is three, and the to-be-adsorbed object is a COF (Chip On Flex or Chip on Film) or an FPC (Flexible Printed Circuit). Detailed description is given below by taking three vacuum adsorption structures as an example. When the to-be-adsorbed circuit board has a relatively large size, the control unit may control all of the three vacuum adsorption structures to form a vacuum environment, and the three vacuum adsorption structures are used to adsorb the circuit board. When the to-be-adsorbed circuit board has a relatively small size, the control unit may control a part of the three vacuum adsorption structures to form a vacuum environment, and the part of the three vacuum adsorption structures is used to adsorb the circuit board. Thus, the pre-press head is applicable to circuit boards having different sizes. Therefore, with the pre-press head provided by the present embodiment, jigs do not need to be replaced according to sizes of circuit boards, and thus purpose of universality is achieved, thereby improving production efficiency, reducing attrition rate of circuit boards and lowering purchasing cost. Meanwhile, inconvenience caused to management and maintenance of a production line by disassembly and installation of the jigs can be avoided.

Referring to FIG. 1, the control unit includes at least one valve structure 200 and at least one vacuum pump 301 which are provided correspondingly, and the valve structure 200 and the vacuum pump 301 are connected to the gas path 101 of the corresponding vacuum adsorption structure, respectively. The step of controlling, by the control unit, formation of a vacuum environment of each of the vacuum adsorption structures according to a size of a to-be-adsorbed object includes: controlling, by the valve structure and the vacuum pump, the formation of the vacuum environment of the corresponding vacuum adsorption structure. Optionally, the step of controlling, by the valve structure and the vacuum pump, the formation of the vacuum environment of the corresponding vacuum adsorption structure includes: when the valve structure is opened, communicating the gas path with the vacuum pump so that the vacuum pump evacuates gas from the vacuum adsorption structure or break the vacuum environment of the vacuum adsorption structure; and when the valve structure is closed, isolating the gas path from the vacuum pump to maintain the current environment of the vacuum adsorption structure. Specifically, when the valve structure 200 is opened, the vacuum pump 301 is communicated with the gas path 101, and in this case, it is possible to pump gas into the gas path 101 to break the vacuum environment of the vacuum adsorption structure or evacuate gas from the gas path 101 as required. When the valve structure 200 is closed, the gas path 101 is isolated from the vacuum pump 301, and at this point, the gas path 101 is in a sealed state and keeps the current environment. Optionally, the valve structure 200 is an electromagnetic valve, the number of the vacuum adsorption structures is three, and the number of the valve structures 200 is three. Therefore, in the technical solution provided by the present embodiment, by controlling individual vacuum adsorption structures separately, jigs do not need to be replaced according to sizes of circuit boards, therefore, purpose of universality is achieved, and also, switch accuracy of circuit boards can be ensured, thereby effectively improving equipment utilization and facilitating decrease of defects.

Referring to FIG. 3, the valve structure 200 includes a control module 201, a valve module 202 and a pipe 203, the valve module 202 is connected to the control module 201 and the pipe 203, respectively, and the pipe 203 is connected to the gas path 101. The step of controlling, by the valve structure and the vacuum pump, the formation of the vacuum environment of the corresponding vacuum adsorption structure includes: switching on or off, by the valve module, communication between the gas path and the vacuum pump under the control of the control module; and evacuating gas from the vacuum adsorption structure or breaking the vacuum environment of the vacuum adsorption structure by the vacuum pump according to whether it is necessary to perform an adsorption operation. In the present embodiment, when the control module 201 controls the valve module 202 to be opened, the vacuum pump 301 is communicated with the gas path 101 to pump gas into the gas path 101 through the pipe 203 so as to break the vacuum environment of the vacuum adsorption structure, or evacuates gas from the gas path 101 for adsorption operation. When the control module 201 controls the valve module 202 to be closed, the gas path 101 is isolated from the vacuum pump 301, and at this time, the gas path 101 is in a sealed state and keeps the current environment.

In the operating method of a pre-press head provided by the present embodiment, the pre-press head includes an adsorption unit and a control unit, the adsorption unit includes at least two vacuum adsorption structures each including a gas path and at least one gas hole, and the gas hole is communicated with the gas path. The control unit is configured to control, according to a size of a to-be-adsorbed object, formation of a vacuum environment of each of the vacuum adsorption structures, and the adsorption unit is configured to adsorb the to-be-adsorbed object under the control of the control unit. In the technical solution provided by the present embodiment, adsorption functions of the vacuum adsorption structures are adjusted according to a size of a to-be-adsorbed circuit board, so that the pre-press head can be applicable to circuit boards having different sizes. Therefore, with the pre-press head provided by the present embodiment, jigs do not need to be replaced according to sizes of circuit boards, and thus universality is achieved, thereby improving production efficiency, reducing attrition rate of circuit boards and lowering purchasing cost. Meanwhile, inconvenience caused to management and maintenance of a production line by disassembly and installation of the jigs can be avoided. In addition, by controlling individual vacuum adsorption structures separately, not only operating requirements can be satisfied to the largest extent, but also can switch accuracy of circuit boards be ensured, thereby effectively improving equipment utilization and facilitating decrease of defects.

It can be understood that, the above implementations are merely exemplary implementations used for explaining the principle of the present invention, but the present invention is not limited thereto. For those skilled in the art, various modifications and improvements can be made without departing from the spirit and essence of the present invention, and these modifications and improvements are also deemed as falling within the protection scope of the present invention.

The invention claimed is:

1. A pre-press head, comprising an adsorption unit and a control unit, wherein the adsorption unit comprises at least two vacuum adsorption structures each comprising a gas path and at least one gas hole, and the gas hole is communicated with the gas path;

the control unit is configured to control, according to a size of a to-be-adsorbed object, formation of a vacuum environment of each of the vacuum adsorption structures; and the adsorption unit is configured to adsorb the to-be-adsorbed object under the control of the control unit, wherein the control unit comprises at least one valve structure and at least one vacuum pump, which are provided correspondingly, the valve structure and the vacuum pump are connected to the gas path of the corresponding vacuum adsorption structure, respectively; and the valve structure and the vacuum pump are configured to control the formation of the vacuum environment of the corresponding vacuum adsorption structure; and wherein the valve structure is configured such that:

when the valve structure is opened, the gas path of the corresponding vacuum adsorption structure is communicated with the vacuum pump so that the vacuum pump evacuates gas from the vacuum adsorption structure and breaks the vacuum environment of the vacuum adsorption structure; and when the valve structure is closed, the gas path of the corresponding vacuum adsorption structure is isolated from the vacuum pump to maintain current environment of the corresponding vacuum adsorption structure, the pre-press head further comprises a plurality of gas paths and a plurality of pipes which corresponds to the plurality of gas paths, respectively;

the plurality of gas paths are arranged concentrically such that one gas path is arranged to surround its inside gas path, and the pipe corresponding to the one gas path is shorter than that of its inside gas path.

2. The pre-press head according to claim 1, wherein the valve structure comprises a control module, a valve module and a pipe, the valve module being connected to the control module and the pipe, respectively, and the pipe being connected to the gas path of the corresponding vacuum adsorption structure;

the valve module is configured to switch on or off communication between the gas path of the corresponding vacuum adsorption structure and the vacuum pump under the control of the control module; and the vacuum pump is configured to evacuate gas from the vacuum adsorption structure or break the vacuum environment of the vacuum adsorption structure as required.

3. The pre-press head according to claim 1, wherein the valve structure is an electromagnetic valve.

4. The pre-press head according to claim 1, wherein the number of the vacuum adsorption structures is three.

5. The pre-press head according to claim 1, wherein the number of the vacuum adsorption structures is three, and the number of the at least one valve structure is three.

6. The pre-press head according to claim 1, comprising one vacuum pump, which is connected to the gas paths of the at least two vacuum adsorption structures, respectively.

7. The pre-press head according to claim 1, comprising valve structures and vacuum pumps, which have a same number and are in one-to-one correspondence.

8. The pre-press head according to claim 1, wherein the to-be-adsorbed object is a Chip on Film or a Flexible Printed Circuit.

9. An operating method of a pre-press head, wherein the pre-press head comprises an adsorption unit and a control unit, the adsorption unit comprises at least two vacuum adsorption structures each comprising a gas path and at least one gas hole, and the gas hole is communicated with the gas path, the pre-press head further comprises a plurality of gas paths and a plurality of pipes which corresponds to the plurality of gas paths, respectively, and the plurality of gas paths are arranged concentrically such that one gas path is arranged to surround its inside gas path, and the pipe corresponding to the one gas path is shorter than that of its inside gas path; and the operating method of a pre-press head comprises:

controlling, by the control unit, formation of a vacuum environment of each of the vacuum adsorption structures according to a size of a to-be-adsorbed object; and adsorbing, by the adsorption unit, the to-be-adsorbed object under the control of the control unit, wherein the control unit comprises at least one valve structure and at least one vacuum pump which are provided correspondingly, the valve structure and the vacuum pump are connected to the gas path of the corresponding vacuum adsorption structure, respectively; and the step of controlling, by the control unit, formation of a vacuum environment of each of the vacuum adsorption structures according to a size of a to-be-adsorbed object comprises:

controlling, by the valve structure and the vacuum pump, the formation of the vacuum environment of the corresponding vacuum adsorption structure; and wherein the step of controlling, by the valve structure and the vacuum pump, the formation of the vacuum environment of the corresponding vacuum adsorption structure comprises:

when the valve structure is opened, communicating the gas path of the corresponding vacuum adsorption structure with the vacuum pump so that the vacuum pump evacuates gas from the vacuum adsorption structure and breaks the vacuum environment of the vacuum adsorption structure; and when the valve structure is closed, isolating the gas path of the corresponding vacuum adsorption structure from the vacuum pump to maintain current environment of the corresponding vacuum adsorption structure.

10. The operating method of a pre-press head according to claim 9, wherein the valve structure comprises a control module, a valve module and a pipe, the valve module is connected to the control module and the pipe, respectively, and the pipe is connected to the gas path of the corresponding vacuum adsorption structure; and the step of controlling, by the valve structure and the vacuum pump, the formation of the vacuum environment of the corresponding vacuum adsorption structure comprises:

switching on or off, by the valve module, communication between the gas path of the corresponding vacuum adsorption structure and the vacuum pump under the control of the control module; and evacuating gas from the vacuum adsorption structure or breaking the vacuum environment of the vacuum adsorption structure as required by the vacuum pump.

11. The operating method of a pre-press head according to claim 9, wherein the valve structure is an electromagnetic valve.

12. The operating method of a pre-press head according to claim 9, wherein the to-be-adsorbed object is a Chip on Film or a Flexible Printed Circuit.

* * * * *